US012571102B2

(12) United States Patent
Kobayashi

(10) Patent No.: US 12,571,102 B2
(45) Date of Patent: Mar. 10, 2026

(54) IGNITION CONTROL METHOD, FILM FORMING METHOD, AND FILM FORMING APPARATUS

(71) Applicant: Tokyo Electron Limited, Tokyo (JP)

(72) Inventor: Takeshi Kobayashi, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 462 days.

(21) Appl. No.: 18/095,657

(22) Filed: Jan. 11, 2023

(65) Prior Publication Data

US 2023/0235460 A1 Jul. 27, 2023

(30) Foreign Application Priority Data

Jan. 25, 2022 (JP) ................................. 2022-009370

(51) Int. Cl.
*C23C 16/509* (2006.01)
*C23C 16/34* (2006.01)
*C23C 16/52* (2006.01)

(52) U.S. Cl.
CPC ............ *C23C 16/509* (2013.01); *C23C 16/34* (2013.01); *C23C 16/52* (2013.01)

(58) Field of Classification Search
CPC .......... H01J 37/32183; H01J 37/32935; C23C 16/509; C23C 16/345; C23C 16/52; C23C 16/507
See application file for complete search history.

(56) References Cited

U.S. PATENT DOCUMENTS

| | | | | |
|---|---|---|---|---|
| 6,144,894 A | * | 11/2000 | Nguyen | ............. H01J 37/32311 62/480 |
| 2017/0345620 A1 | * | 11/2017 | Coumou | ............... H03F 1/3223 |
| 2020/0168439 A1 | * | 5/2020 | Bhutta | .............. H01J 37/32183 |
| 2020/0312654 A1 | * | 10/2020 | Ito | ...................... C23C 16/45546 |
| 2021/0319929 A1 | * | 10/2021 | Matsumura | .............. H01B 7/18 |
| 2022/0172933 A1 | * | 6/2022 | Kapoor | ............. H01J 37/32174 |

FOREIGN PATENT DOCUMENTS

| | | |
|---|---|---|
| JP | 2017-118434 A | 6/2017 |
| JP | 2020-161722 A | 10/2020 |

* cited by examiner

*Primary Examiner* — Joseph A Miller, Jr.
(74) *Attorney, Agent, or Firm* — Venjuris, P.C.

(57) ABSTRACT

An ignition control method is performed in a film forming apparatus including: a processing container that accommodates a substrate; a plasma box; a pair of electrodes disposed in the processing container to sandwich the plasma box; and a radio-frequency (RF) power supply connected to the pair of electrodes via a matching box. The ignition control method includes: (a) setting a process type that specifies a processing condition of the substrate; (b) measuring first information indicating a voltage between the pair of electrodes for each of a plurality of adjustment positions of the variable capacitor; (c) determining a preset value of the variable capacitor based on the first information measured in (b); and (d) setting an initial position of each of the plurality of adjustment positions of the variable capacitor to the preset value determined in (c).

9 Claims, 9 Drawing Sheets

FIG. 5

| C1 \ C2 | 0 | 5 | 10 | 15 | 20 | 25 | 30 | 35 | 40 | 45 | 50 | 55 | 60 | 65 | 70 | 75 | 80 | 85 | 90 | 95 | 100 |
|---|---|---|---|---|---|---|---|---|---|---|---|---|---|---|---|---|---|---|---|---|---|
| 0 | 251 | 264 | 284 | 299 | 308 | 306 | 299 | 283 | 264 | 241 | 219 | 197 | 176 | 157 | 139 | 124 | 109 | 98 | 88 | 79 | 70 |
| 5 | 210 | 229 | 260 | 295 | 328 | 353 | 367 | 365 | 347 | 321 | 287 | 253 | 219 | 191 | 165 | 143 | 125 | 108 | 95 | 83 | 74 |
| 10 | 177 | 199 | 238 | 289 | 348 | 408 | 456 | 473 | 449 | 396 | 334 | 276 | 230 | 189 | 157 | 131 | 110 | 93 | 81 | 69 | 59 |
| 15 | 151 | 175 | 221 | 286 | 376 | 483 | 583 | 606 | 524 | 418 | 321 | 244 | 190 | 150 | 119 | 98 | 80 | 68 | 56 | 49 | 43 |
| 20 | 129 | 153 | 204 | 281 | 405 | 582 | 754 | 707 | 516 | 358 | 251 | 183 | 138 | 106 | 83 | 66 | 55 | 46 | 39 | 33 | 29 |
| 25 | 111 | 135 | 187 | 279 | 436 | 706 | 932 | 688 | 421 | 271 | 185 | 130 | 96 | 74 | 59 | 46 | 39 | 31 | 26 | 23 | 20 |
| 30 | 95 | 117 | 170 | 272 | 481 | 922 | 1013 | 535 | 296 | 184 | 122 | 86 | 64 | 49 | 39 | 32 | 26 | 20 | 16 | 16 | 13 |
| 35 | 82 | 101 | 155 | 266 | 536 | 1214 | 862 | 387 | 208 | 128 | 85 | 59 | 44 | 33 | 26 | 23 | 20 | 15 | 13 | 11 | 10 |
| 40 | 69 | 89 | 142 | 262 | 601 | 1525 | 630 | 271 | 145 | 90 | 60 | 43 | 32 | 25 | 20 | 16 | 13 | 10 | 10 | 9 | 7 |
| 45 | 59 | 78 | 128 | 257 | 689 | 1580 | 453 | 195 | 105 | 65 | 43 | 31 | 23 | 19 | 13 | 10 | 10 | 10 | 7 | 7 | 7 |
| 50 | 52 | 67 | 117 | 251 | 803 | 1272 | 326 | 142 | 77 | 48 | 33 | 25 | 16 | 13 | 10 | 10 | 7 | 7 | 7 | 5 | 3 |
| 55 | 43 | 59 | 107 | 244 | 945 | 927 | 244 | 107 | 59 | 37 | 25 | 16 | 13 | 10 | 9 | 7 | 5 | 5 | 7 | 3 | 3 |
| 60 | 38 | 51 | 96 | 240 | 1164 | 652 | 179 | 80 | 44 | 27 | 18 | 13 | 10 | 7 | 7 | 4 | 3 | 3 | 4 | 3 | 3 |
| 65 | 33 | 44 | 87 | 235 | 1463 | 475 | 135 | 61 | 33 | 21 | 14 | 10 | 9 | 7 | 7 | 3 | 3 | 3 | 3 | 3 | 3 |
| 70 | 29 | 39 | 78 | 228 | 1979 | 352 | 100 | 45 | 26 | 16 | 12 | 9 | 7 | 7 | 3 | 3 | 3 | 3 | 3 | 3 | 2 |
| 75 | 23 | 34 | 70 | 220 | 2458 | 259 | 76 | 35 | 20 | 13 | 9 | 7 | 7 | 3 | 3 | 3 | 2 | 3 | 3 | 3 | 3 |
| 80 | 21 | 28 | 60 | 213 | 2518 | 196 | 59 | 28 | 16 | 10 | 7 | 7 | 3 | 3 | 3 | 3 | 1 | 1 | 3 | 2 | 2 |
| 85 | 16 | 25 | 55 | 208 | 2155 | 152 | 46 | 21 | 13 | 7 | 4 | 3 | 2 | 1 | 1 | 1 | 1 | 1 | 1 | 0 | 0 |
| 90 | 16 | 21 | 50 | 201 | 1518 | 122 | 38 | 16 | 10 | 7 | 3 | 3 | 0 | 1 | 0 | 3 | 0 | 0 | 0 | 0 | 0 |
| 95 | 13 | 20 | 45 | 194 | 1079 | 95 | 30 | 13 | 10 | 4 | 3 | 3 | 0 | 0 | 0 | 1 | 0 | 0 | 0 | 0 | 0 |
| 100 | 10 | 16 | 40 | 183 | 798 | 71 | 24 | 12 | 7 | 4 | 3 | 3 | 2 | 1 | 0 | 0 | 0 | 0 | 1 | 0 | 0 |

| Process Type | Preset | | Preset update warning | | Start | | | | | Pf [W] |
|---|---|---|---|---|---|---|---|---|---|---|
| | C1 [%] | C2 [%] | C1 [%] | C2 [%] | Frequency [MHz] | Time [sec] | $V_B$ [V] | P [Torr] | | |
| A | 60 | 20 | | | | | | | | |
| B | | | | | | | | | | |
| C | | | | | | | | | | |
| D | | | | | | | | | | |
| E | | | | | | | | | | |

IGNITION CONTROL METHOD, FILM FORMING METHOD, AND FILM FORMING APPARATUS

CROSS-REFERENCE TO RELATED APPLICATION

This application is based on and claims priority from Japanese Patent Application No. 2022-009370 filed on Jan. 25, 2022 with the Japan Patent Office, the disclosure of which is incorporated herein in its entirety by reference.

TECHNICAL FIELD

The present disclosure relates to an ignition control method, a film forming method, and a film forming apparatus.

BACKGROUND

Japanese Patent Laid-Open Publication No. 2020-161722 discloses, for example, a batch-type deposition apparatus in which a plurality of substrates is accommodated in a processing container and nitride films are deposited on the plurality of substrates by an atomic layer deposition (ALD) method. A film forming method disclosed in Japanese Patent Laid-Open Publication No. 2020-161722 includes the steps of supplying a raw material gas containing silicon, supplying hydrogen gas activated by plasma, supplying a thermally activated nitriding gas to nitride a silicon element, supplying a plasma-activated nitriding gas to nitride the silicon element, and supplying a purge gas between the steps. Thus, a silicon nitride film may be formed to have a desired film thickness distribution.

Japanese Patent Laid-Open Publication No. 2017-118434 discloses, for example, an electronic matcher that does not include mechanical elements and is capable of performing impedance matching at high speed.

SUMMARY

An aspect of the present disclosure provides an ignition control method executed in a film forming apparatus including: a processing container that accommodates a substrate; a plasma box formed in the processing container; a pair of electrodes disposed in the processing container to sandwich the plasma box; and a radio-frequency (RF) power supply connected to the pair of electrodes via a matching box having a variable capacitor. The ignition control method includes: (a) setting a process type that specifies a processing condition of the substrate; (b) measuring first information indicating a voltage between the pair of electrodes for each of a plurality of adjustment positions of the variable capacitor when a radio-frequency voltage of a first frequency is applied from the RF power supply to the pair of electrodes for each process type; (c) determining a preset value of the variable capacitor based on the first information measured in (b); and (d) setting an initial position of each of the plurality of adjustment positions of the variable capacitor to the preset value determined (c).

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 5 is a table illustrating the voltage between electrodes at each adjustment position of a variable capacitor when RF of 13.56 MHz is applied.

FIG. 6 is a diagram illustrating an example of setting information such as preset values for each process type according to the embodiment.

DETAILED DESCRIPTION

Figure 1:
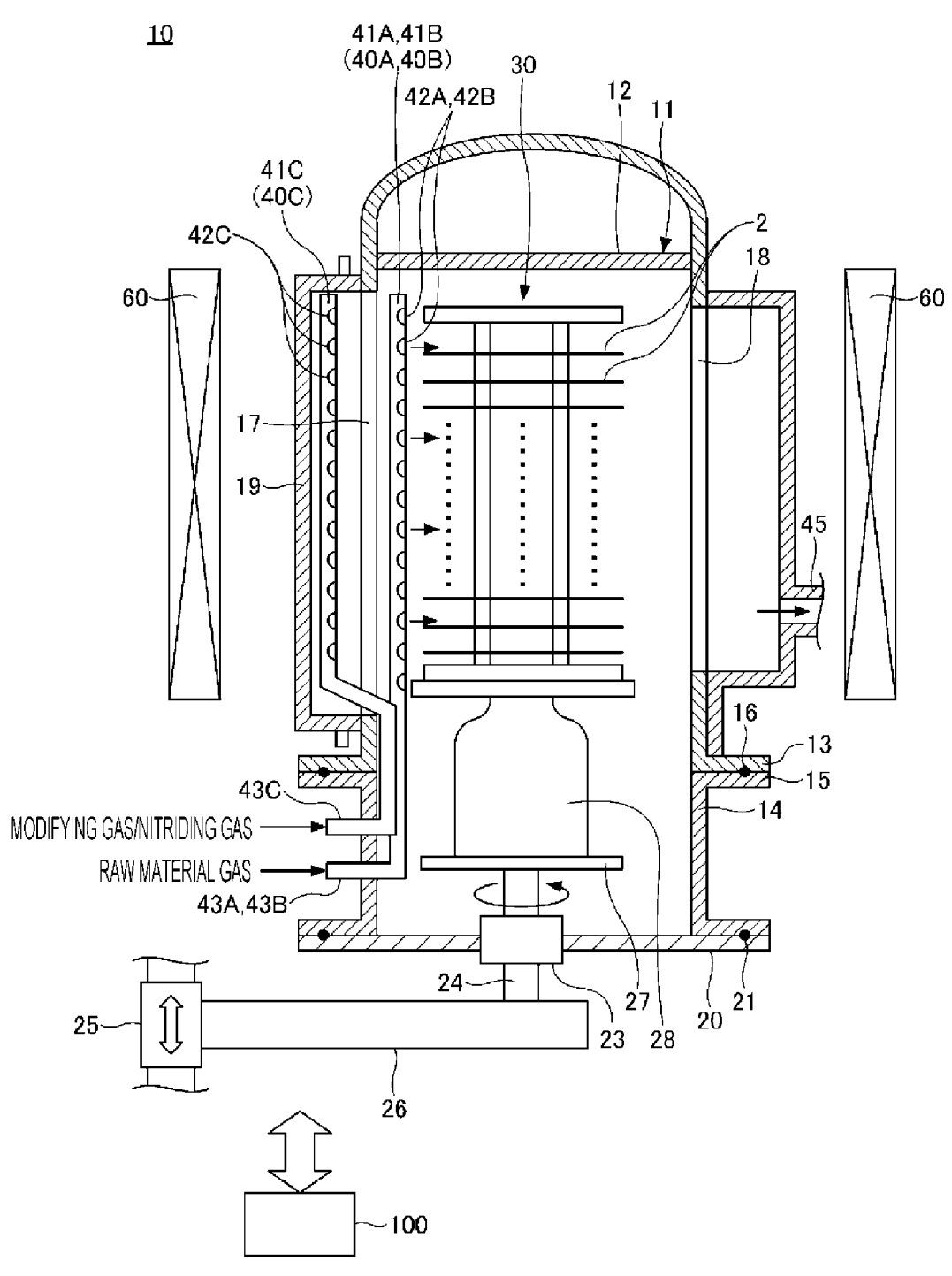
FIG. 1 is a diagram illustrating a configuration example of a film forming apparatus according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for implementing the present disclosure will be described with reference to the accompanying drawings. In each of the drawings, the same elements may be designated by the same reference numerals and redundant descriptions may be omitted.

In the present specification, parallel, perpendicular, orthogonal, horizontal, vertical, up and down, left and right directions are allowed to deviate to the extent that the effects of the embodiments are not impaired. The shape of the corners is not limited to right angles and may be arcuately rounded. Parallel, perpendicular, orthogonal, horizontal, vertical, circular, and coincident may include substantially parallel, substantially perpendicular, substantially orthogonal, substantially horizontal, substantially vertical, substantially circular, and substantially coincident.

[Film Forming Apparatus]

First, a film forming apparatus 10 according to the present embodiment will be described with reference to FIG. 1. FIG. 1 is a diagram illustrating the film forming apparatus 10 according to the embodiment. The film forming apparatus 10 stores a plurality of wafers in a processing container 11 and forms a predetermined film such as a nitride film on the plurality of wafers by an atomic layer deposition (ALD) method. The film forming apparatus 10 is an example of an apparatus that executes such a film forming method.

The film forming apparatus 10 is a batch-type vertical heat treatment apparatus that processes a plurality of wafers. However, the film forming apparatus 10 is not limited to such a heat treatment apparatus. For example, the film forming apparatus 10 may be a single-wafer type apparatus that processes wafers one by one. Also, the film forming apparatus 10 may be a semi-batch type apparatus. A semi-batch type apparatus may be an apparatus in which a plurality of wafers disposed around the rotation centerline of a rotary table is rotated together with the rotary table and sequentially passed through a plurality of regions supplied with different gases.

The predetermined film is, for example, a silicon nitride film (SiN), but is not limited thereto. The silicon nitride film which is formed by the film forming method performed by the film forming apparatus 10 according to the present embodiment is formed on a wafer by alternately supplying a raw material gas (e.g., dichlorosilane gas) and plasma of a nitriding gas (e.g., ammonia ($NH_3$) gas) to the wafer. In such a film forming method, the film thickness of the nitride film formed within the plane of the wafer tends to be thicker at the edge of the wafer. In order to suppress this, there is a method of suppressing the film thickness at the edge of the wafer by supplying plasma of nitrogen ($N_2$) gas before supplying plasma of ammonia gas.

In a film deposition using plasma, even higher film quality and film thickness control are needed, and various types of gases are used to generate plasma, from plasma processing using a single gas to plasma processing using a plurality of gases.

The minimum ignition voltage for each gas is individually different for different gases used, as known from Paschen's Curve. Thus, the minimum ignition voltage needed for plasma ignition differs depending on the use of different gases. Therefore, a stable plasma ignition without reflected waves is needed for each different gas. In addition, a stable plasma ignition is desired, which may cope with temperature changes caused by plasma, the effects of reaction products generated by film formation, and the effects of periodical cleaning of the processing chamber for removing reaction products. Therefore, the film forming method according to the present embodiment provides a technology that enables more stable plasma ignition and alignment operation.

The film forming apparatus 10 includes a processing container 11 which accommodates the wafers 2 and forms a space in which the wafers 2 are processed, a cover 20 that airtightly closes the opening at the lower end of the processing container 11, and a substrate holder 30 that holds the wafer 2. The wafer 2 is, for example, a semiconductor substrate, more particularly a silicon wafer. The substrate holder 30 is also called a wafer boat.

The processing container 11 includes a cylindrical processing container body 12 with an open bottom and a ceiling. The processing container body 12 is made of, for example, quartz. A flange portion 13 is formed at the lower end of the processing container body 12. The processing container 11 also has, for example, a cylindrical manifold 14. The manifold 14 is made of, for example, stainless steel. A flange portion 15 is formed at the upper end of the manifold 14, and the flange portion 13 of the processing container body 12 is provided on the flange portion 15. A sealing member 16 such as an O-ring is disposed between the flange portion 15 and the flange portion 13.

The cover 20 is airtightly attached to the opening at the lower end of the manifold 14 via a sealing member 21 such as an O-ring. The cover 20 is formed of, for example, stainless steel. A through hole is formed in the central portion of the cover 20 to penetrate the cover 20 in the vertical direction. A rotary shaft 24 is disposed in the through hole. A magnetic fluid seal portion 23 seals a gap between the cover 20 and the rotary shaft 24. A lower end of the rotary shaft 24 is rotatably supported by an arm 26 of an elevating unit 25. A rotary plate 27 is provided at the upper end of the rotary shaft 24. A substrate holder 30 is provided on the rotary plate 27 via a heat insulating base 28.

The substrate holder 30 holds a plurality of wafers 2 at intervals in the vertical direction. Each of the plurality of wafers 2 is horizontally held. The substrate holder 30 is made of, for example, quartz ($SiO_2$) or silicon carbide (SiC). When the elevating unit 25 is lifted, the cover 20 and the substrate holder 30 are lifted, the substrate holder 30 is loaded into the processing container 11, and the opening at the lower end of the processing container 11 is sealed with the cover 20. Further, when the elevating unit 25 is lowered, the cover 20 and the substrate holder 30 are lowered, and the substrate holder 30 is unloaded out of the processing container 11. When the rotary shaft 24 is rotated, the substrate holder 30 rotates together with the rotary plate 27.

The film forming apparatus 10 includes three gas supply pipes 40A, 40B, and 40C. The gas supply pipes 40A, 40B, and 40C are made of, for example, quartz ($SiO_2$) The gas supply pipes 40A, 40B, and 40C supply gases to the inside of the processing container 11. The types of gases will be described later. A single gas supply pipe may sequentially discharge one or more types of gases. A plurality of gas supply pipes may also discharge the same type of gas.

The gas supply pipes 40A, 40B, and 40C include horizontal pipes 43A, 43B, and 43C that horizontally pass through the manifold 14 and vertical pipes 41A, 41B, and 41C that are disposed vertically inside the processing container 11. The vertical pipes 41A, 41B, and 41C include a plurality of air supply ports 42A, 42B, and 42C spaced apart in the vertical direction. The gas supplied to the horizontal pipes 43A, 43B, and 43C is sent to the vertical pipes 41A, 41B, and 41C and discharged horizontally from the plurality of air supply ports 42A, 42B, and 42C. The vertical pipe 41C is disposed inside a plasma box 19. The vertical pipes 41A and 41B are disposed inside the processing container 11.

The film forming apparatus 10 includes an exhaust pipe 45. The exhaust pipe 45 is connected to an exhaust apparatus (not illustrated). The exhaust apparatus includes a vacuum pump and exhausts the inside of the processing container 11. An exhaust port 18 is formed in the processing container body 12. The exhaust port 18 is disposed to face the air supply ports 42A, 42B, and 42C. Gas horizontally discharged from the air supply ports 42A, 42B, and 42C is exhausted from the exhaust pipe 45 after passing through the exhaust port 18. The exhaust apparatus sucks the gas inside the processing container 11 and sends the gas to an abatement apparatus. The abatement apparatus releases the exhaust gas into the atmosphere after removing harmful components from the exhaust gas.

The film forming apparatus 10 further includes a heating unit 60. The heating unit 60 is disposed outside the processing container 11 and heats the inside of the processing container 11 from the outside of the processing container 11. For example, the heating unit 60 is formed in a cylindrical shape to surround the processing container body 12. The heating unit 60 is constituted by, for example, an electric heater. The heating unit 60 heats the inside of the processing container 11 to improve the processing capability of the gas supplied into the processing container 11.

[Plasma Box]

Figure 2:
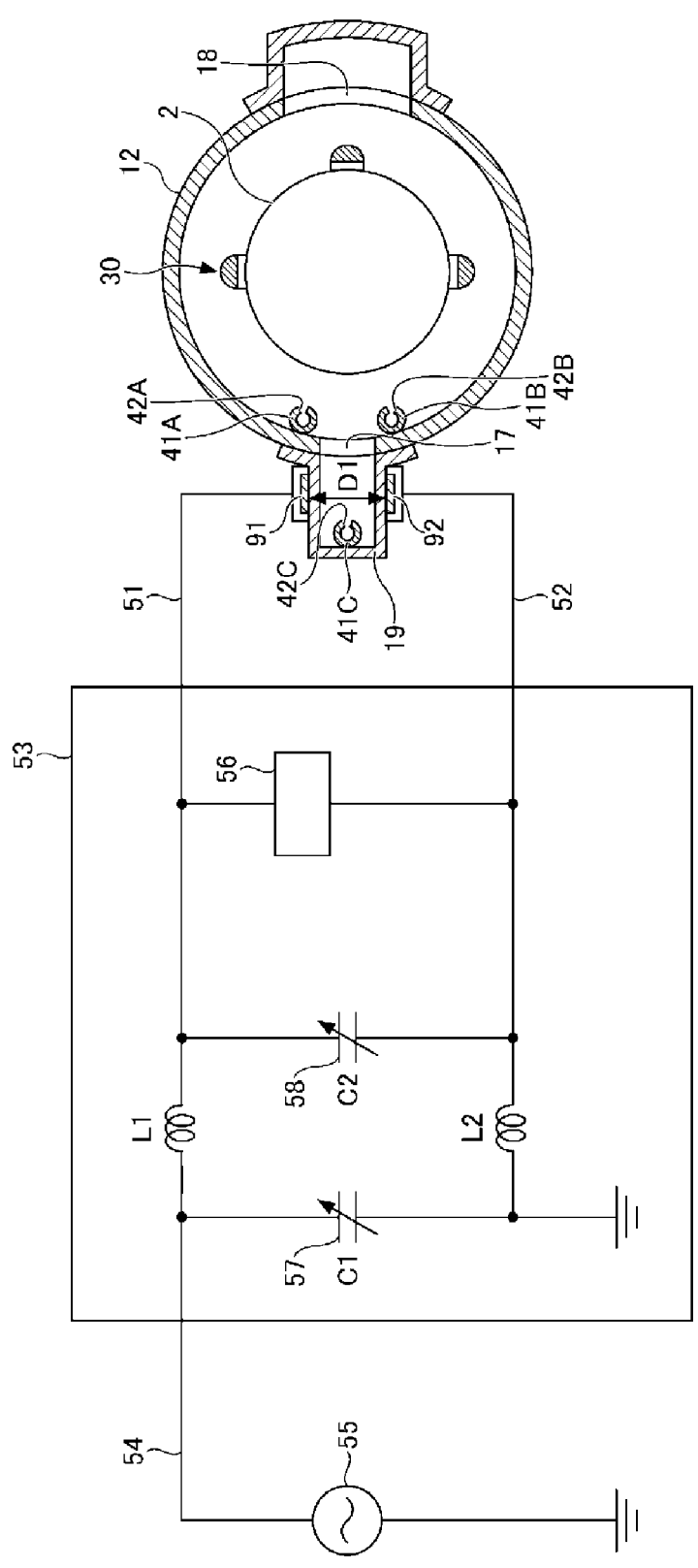
FIG. 2 is a diagram illustrating the configuration of an electronic matcher and a plasma box according to the embodiment.

FIG. 2 is a diagram illustrating the configuration of an electronic matcher 53 and a plasma box 19 according to the embodiment. As illustrated in FIGS. 1 and 2, an opening 17 is formed in a part of the processing container body 12 in the circumferential direction. A plasma box 19 is formed on the side surface of the processing container 11 to surround the opening 17. The plasma box 19 is formed to protrude radially outward from the processing container body 12, and is formed, for example, in a substantially U shape when viewed in the vertical direction.

A pair of electrodes (electrode pair) 91 and 92 are disposed to sandwich the plasma box 19. The electrodes 91 and 92 are a pair of parallel electrodes that are placed facing each other outside the plasma box 19. The electrodes 91 and 92 are elongated in the vertical direction to face each other, similarly to the vertical pipe 41C. The electrodes 91 and 92 are connected to a RF power supply 55 via the electronic matcher 53 and are applied with a radio-frequency voltage from the RF power supply 55.

The electronic matcher 53 is connected in series between the RF power supply 55 and the electrodes 91 and 92 via voltage supply lines 51, 52, and 54. The electronic matcher 53 includes a first variable capacitor 57 (capacitive element C1), a second variable capacitor 58 (capacitive element C2), and coils L1 and L2.

When supplying RF power from the RF power supply 55 to the load side (i.e., the plasma box 19 side), the electronic matcher 53 matches the impedance between the RF power supply 55 and the load to improve the supply efficiency of the RF power.

The stability of plasma ignition is enhanced by rapid response from plasma excitation to stabilization and convergence in a short time. Also, the stability of plasma ignition is implemented by stabilizing the RF power to plasma and suppressing plasma fluctuations. For this purpose, it is necessary to perform an impedance matching at high speed and suppress reflected waves.

Since a matching box including mechanical elements performs a mechanical operation of driving a variable capacitor with a motor to match the impedance between the RF power supply 55 and the load, it takes several seconds to complete the impedance matching.

In the film forming method according to the present embodiment, an impedance matching is performed using an electronic matcher 53 that does not include mechanical elements. That is, a change in the output end voltage of the electronic matcher 53 due to a change in impedance is grasped in a short time (e.g., within 1 second) immediately before plasma ignition (the voltage between the electrodes 91 and 92, hereinafter also referred to as an inter-electrode voltage), and an inter-electrode voltage having a margin equal to or greater than the value necessary for plasma ignition is applied. This provides a technology capable of suppressing reflected waves and performing a more stable plasma ignition and matching operation.

The electronic matcher 53 is a matching box having a variable capacitor. A variable capacitor may be applied which uses a variable-capacitance diode constituted by a control line for applying a control voltage and a main line for passing a RF current, thereby changing the thickness of a depletion layer by a control line that applies a control voltage and changing the capacitance of the capacitor.

In the present embodiment, an electronic matcher 53 having the configuration using a first variable capacitor 57 (capacitive element C1) and a second variable capacitor 58 (capacitive element C2) is used as an example of the variable capacitor. However, the variable inductors of coils L1 and L2 may be used as variable reactors instead of the variable capacitors. In addition, when an AC winding and a control winding are wound around a magnetic core, and a DC current is passed through the control winding, a variable inductance in which the inductance of the AC winding changes due to the nonlinear magnetic properties of the magnetic material may be used as the circuit configuration.

The control unit 100 illustrated in FIG. 1 changes the adjustment positions of the first variable capacitor 57 and the second variable capacitor 58 using the electronic matcher 53 according to the ignition control method (to be described later). This adjusts the capacitive elements C1 and C2 of the first variable capacitor 57 and the second variable capacitor 58, respectively. Thus, the electronic matcher 53 adjusts its own impedance to match the output impedance of the RF power supply 55 and the load impedance. The electronic matcher 53 is provided with a sensor 56 to measure the inter-electrode voltage (the voltage across a distance D1 in FIG. 2). The adjustment positions of the first variable capacitor 57 and the second variable capacitor 58 are hereinafter also referred to as adjustment positions of the capacitive elements C1 and C2. The initial positions of the adjustment positions of the first variable capacitor 57 and the second variable capacitor 58 are hereinafter also referred to as initial positions of the capacitive elements C1 and C2.

[Gas Supply]

The plasma box 19 accommodates vertical pipes 41C for modifying gas and nitriding gas. The modifying gas is discharged horizontally toward the opening 17 from the air supply port 42C of the vertical pipe 41C, and supplied into the processing container body 12 through the opening 17. Similarly, the nitriding gas is discharged horizontally toward the opening 17 from the air supply port 42C of the vertical pipe 41C and supplied into the processing container body 12 through the opening 17.

The vertical pipes 41A and 41B for raw material gas are disposed outside the plasma box 19 and outside the opening 17 in the processing container body 12. The vertical pipe 41B for nitriding gas may be disposed inside the plasma box 19, and each gas may be supplied separately from the vertical pipe 41C for the modifying gas.

A radio-frequency electric field is applied to the internal space of the plasma box 19 by applying a radio-frequency voltage between the electrodes 91 and 92. The modifying gas is formed into plasma by the radio-frequency electric field in the inner space of the plasma box 19. When the modifying gas contains nitrogen gas, the nitrogen gas is formed into plasma to generate nitrogen radicals. When the modifying gas contains hydrogen gas, the hydrogen gas is formed into plasma to generate hydrogen radicals. When the modifying gas contains ammonia gas, the ammonia gas is formed into plasma to generate ammonia radicals. The active species are supplied into the processing container body 12 through the opening 17 to modify a Si-containing layer.

Modifying the Si-containing layer includes, for example, removing halogen elements contained in the Si-containing layer. By removing the halogen elements, dangling bonds of Si may be formed. As a result, the Si-containing layer may be activated and the nitriding of the Si-containing layer may be promoted. Nitriding the Si-containing layer is performed after the Si-containing layer is modified in the present embodiment.

Figure 3:
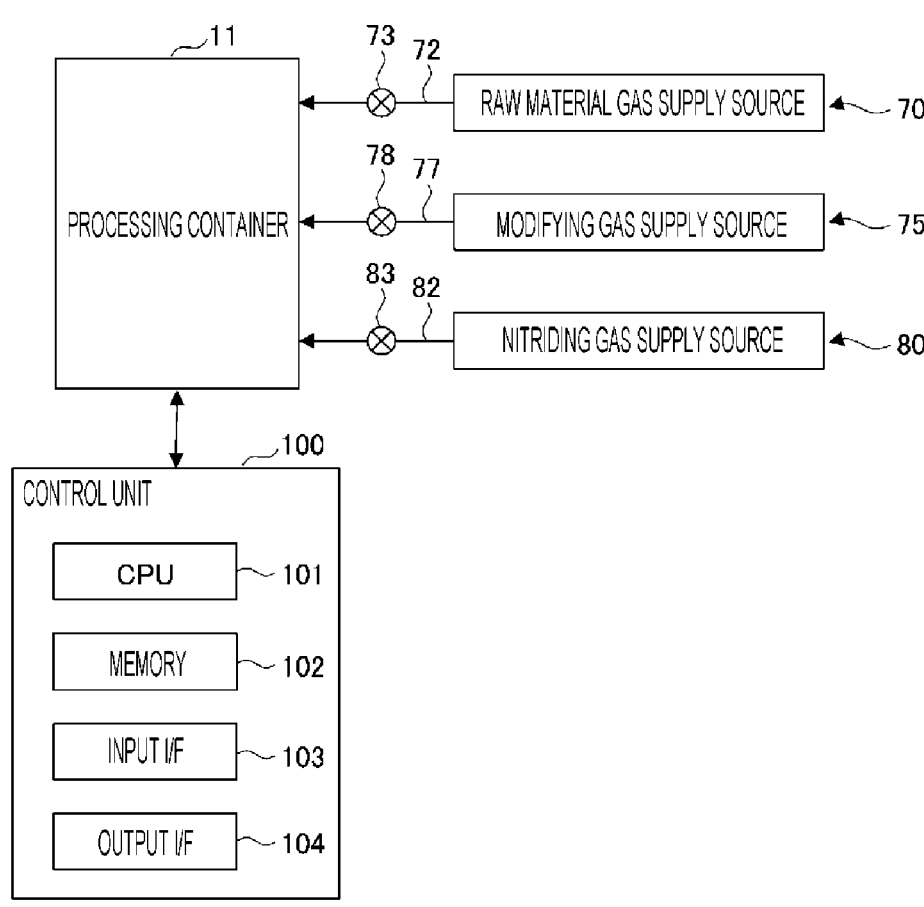
FIG. 3 is a diagram illustrating a gas supply source and a control unit of the film forming apparatus according to the embodiment.

FIG. 3 is a diagram illustrating a gas supply unit and a control unit of the film forming apparatus 10 according to the embodiment. In the film forming apparatus 10, the gas supply unit includes a raw material gas supply source 70, a modifying gas supply source 75, and a nitriding gas supply source 80. The raw material gas supply source 70 supplies the raw material gas to the inside of the processing container 11. The raw material gas contains an element to be nitrided (e.g., silicon).

For example, dichlorosilane (DCS: $SiH_2Cl_2$) gas is used as the raw material gas. Although the raw material gas of the present embodiment is DCS gas, the technology of the present disclosure is not limited thereto. In addition to DCS gas, monochlorosilane (MCS: $SiH_3Cl$) gas, trichlorosilane (TCS: $SiHCl_3$) gas, silicon tetrachloride (STC: $SiCl_4$) gas, and hexachlorodisilane (HCDS: $Si_2Cl_6$) gas may be used as the raw material gas. When the gases are supplied to the wafer 2, a layer containing silicon (Si) (Si-containing layer) may be formed on the wafer 2. Since the raw material gas contains a halogen element, the Si-containing layer contains a halogen element in addition to Si.

The raw material gas pipe 72 connects the raw material gas supply source 70 and the gas supply pipes 40A and 40B, and sends the raw material gas from the raw material gas supply source 70 to the gas supply pipes 40A and 40B. The raw material gas is discharged horizontally toward the wafer 2 from the air supply ports 42A and 42B of the vertical pipes 41A and 41B. A raw material gas flow control valve 73 is provided in the middle of the raw material gas pipe 72 and controls the flow rate of the raw material gas.

The modifying gas supply source 75 modifies the Si-containing layer by supplying the modifying gas into the processing container 11. Modifying the Si-containing layer includes, for example, removing halogen elements contained in the Si-containing layer. When the halogen elements are removed, dangling bonds of Si may be formed. As a result, the Si-containing layer may be activated and the nitriding of the Si-containing layer may be promoted. Nitrogen gas, hydrogen gas, ammonia gas, or a gas containing any of the gases may be used as the modifying gas.

The modifying gas pipe 77 connects the modifying gas supply source 75 and the gas supply pipe 40C, and sends the modifying gas from the modifying gas supply source 75 to the gas supply pipe 40C. The modifying gas is discharged horizontally toward the wafer 2 from the air supply port 42C of the vertical pipe 41C. A modifying gas flow control valve 78 is provided in the middle of the modifying gas pipe 77 and controls the flow rate of the modifying gas.

The nitriding gas supply source 80 nitrides the Si-containing layer by supplying the nitriding gas into the processing container 11. As for the nitriding gas, for example, ammonia ($NH_3$) gas, organic hydrazine compound gas, amine-based gas, NO gas, $N_2O$ gas, or $NO_2$ gas is used. As for the organic hydrazine compound gas, for example, hydrazine ($N_2H_4$) gas, diazene ($N_2H_2$) gas, or monomethylhydrazine (MMH) gas is used. As for the amine-based gas, for example, monomethylamine gas is used.

A nitriding gas pipe 82 connects the nitriding gas supply source 80 and the gas supply pipe 40C, and sends the nitriding gas from the nitriding gas supply source 80 to the gas supply pipe 40C. The nitriding gas is discharged horizontally toward the wafer 2 from the air supply port 42C of the vertical pipe 41C. A nitriding gas flow control valve 83 is provided in the middle of the nitriding gas pipe 82 to control the flow rate of the nitriding gas.

A purge gas supply (not illustrated) may be provided. When the purge gas is supplied into the processing container 11, the raw material gas, the modifying gas, and the nitriding gas remaining inside the processing container 11 are removed. For example, an inert gas is used as the purge gas. A rare gas such as Ar gas or $N_2$ gas is used as the inert gas.

As illustrated in FIG. 3, the film forming apparatus 10 includes a control unit 100 that controls the film forming apparatus 10. The control unit 100 is constituted by, for example, a computer, and includes a central processing unit (CPU) 101 and a memory 102. The memory 102 stores programs for controlling various processes executed in the film forming apparatus 10. The control unit 100 controls the operation of the film forming apparatus 10 by causing the CPU 101 to execute programs stored in the memory 102. The control unit 100 also includes an input interface 103 and an output interface 104. The control unit 100 receives signals from the outside through the input interface 103 and transmits the signals to the outside through the output interface 104.

Such a program is stored in a computer-readable medium and may be installed from the medium in the memory 102 of the control unit 100. The computer-readable recording medium may be, for example, a hard disk (HD), a flexible disk (FD), a compact disk (CD), a magneto-optical disk (MO), or a memory card. The program may be downloaded from a server via the Internet and installed in the memory 102 of the control unit 100.

[Paschen's Curve]

Figure 4:
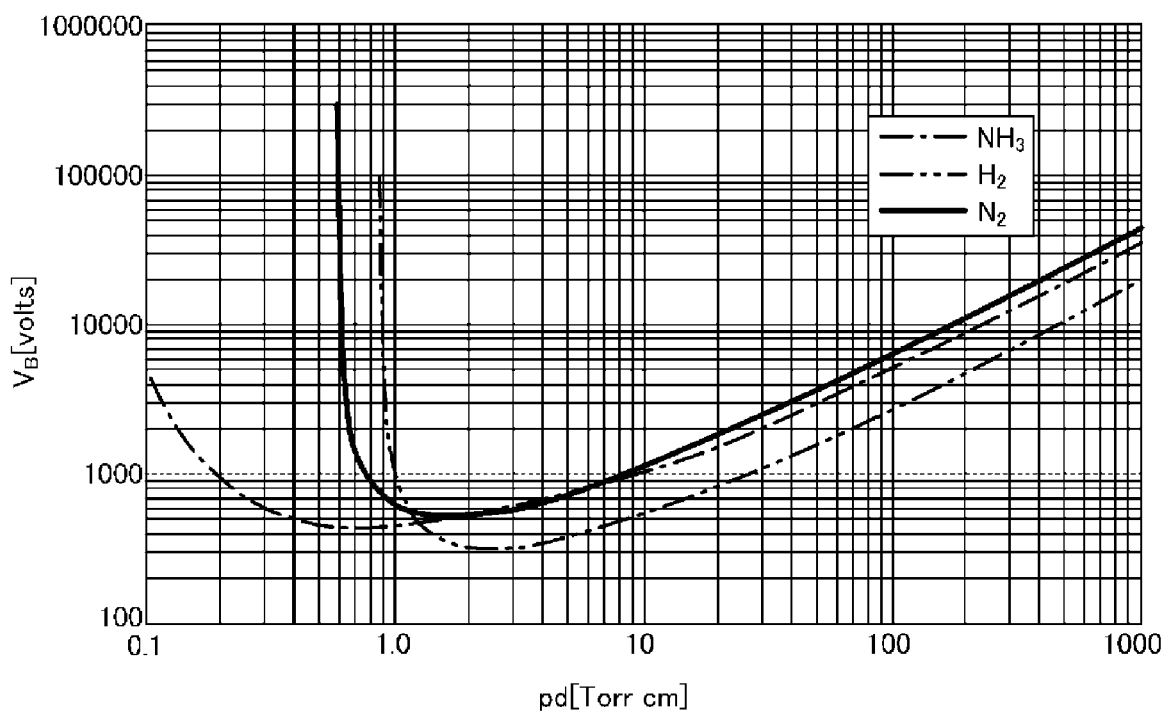
FIG. 4 is a diagram illustrating a Paschen's curve.

FIG. 4 is a diagram illustrating Paschen's curves of $NH_3$ gas, $H_2$ gas, and $N_2$ gas. The horizontal axis indicates the multiplication value pd of a pressure p in the processing container body 12 and an inter-electrode distance d, and the vertical axis indicates the discharge voltage (minimum ignition voltage) VB needed for plasma ignition for each gas.

It is assumed that the plasma box 19 is supplied with nitrogen ($N_2$) gas. The discharge voltage $V_B$ at the intersection of the Paschen's curve of $N_2$ gas and the dotted line representing pD1 (D1: a distance between the electrodes 91 and 92; see, e.g., FIG. 2) is 1000 V. That is, in the plasma box 19 in the nitrogen gas atmosphere, plasma may be ignited in the plasma box 19 by applying a voltage equal to or higher than the discharge start voltage according to the Paschen's curve, that is, a voltage equal to or higher than 1000 V between the electrodes 91 and 92 to generate plasma. In other words, in the plasma box 19, the minimum ignition voltage (i.e., the discharge voltage $V_B$) between the electrodes is 1000 V, and even when a voltage lower than 1000 V is applied between the electrodes 91 and 92, the plasma does not ignite within the plasma box 19.

In the ignition control method according to the present embodiment, the electronic matcher 53 is used to suppress the reflected wave, thereby providing a technology capable of performing a more stable plasma ignition. This makes it possible to further improve the controllability of the film thickness and film quality of the wafer 2.

The stable plasma ignition in the plasma box 19 may be performed by controlling the voltage between the electrodes 91 and 92 (i.e., the inter-electrode voltage) with respect to the lowest ignition voltage (discharge voltage) $V_B$ obtained from the Paschen's curve. Therefore, the adjustment positions of the first variable capacitor 57 and the second variable capacitor 58 in the electronic matcher 53 are controlled to control the "inter-electrode voltage" at the time of plasma ignition with respect to the discharge voltage obtained from the Paschen's curve. Thus, the capacitive elements C1 and C2 of the first variable capacitor 57 and the second variable capacitor 58 are adjusted. In addition to adjusting the capacitive elements C1 and C2, the frequency of the RF power supply 55 may be variably controlled. In this case, the RF power supply 55 uses a frequency-variable RF power supply whose frequency is variably controllable.

[Table]

The sensor 56 measures the inter-electrode voltage at each adjustment position of the first variable capacitor 57 and the second variable capacitor 58 for each frequency of the radio frequency supplied by the RF power supply 55 and for each different gas. A table which stores the inter-electrode voltage at each adjustment position (at each position in the matrices C1 and C2 in FIG. 5) is created from the measured values.

When a first frequency such as 13.56 MHz or 14.56 MHz, and a radio-frequency voltage with a power that does not ignite plasma (e.g., 5 W) are applied from the RF power supply 55 between the electrodes 91 and 92, the inter-electrode voltage is measured at each position of the matrices C1 and C2. When a first frequency such as 13.56 MHz or 14.56 MHz, and a radio-frequency voltage with a power that does not ignite plasma (e.g., 100 W) are applied from the RF power supply 55 between the electrodes 91 and 92, the inter-electrode voltage is measured at each position of the C1 and C2 matrices. The table is stored, for example, in the memory 102.

When measuring the inter-electrode voltage, nitrogen gas is supplied from the air supply ports 42A, 42B, and 42C of the vertical pipes 41A, 41B, and 41C. However, the nitrogen gas may be supplied from at least one of the air supply ports 42A, 42B, and 42C of the vertical pipes 41A, 41B, and 41C.

Each position of the matrices C1 and C2 is shifted from 0% of the minimum position to 100% of the maximum position in 5% increments. From the measured value of the inter-electrode voltage when the adjustment positions of C1 and C2 are changed in increments of 5%, the inter-electrode voltage needed for plasma ignition at each position of C1 and C2 is calculated and stored in the table of FIG. 5. In FIG. 5, the value is changed in increments of 5%, but the value is not limited thereto and the increment value may be changed.

Such a table is created for each process type. The process type is identification information that specifies the processing conditions of the substrate given by the frequency of the radio frequency output from the RF power supply 55, the type of gas supplied into the processing container, and the temperature and pressure within the processing container.

For each process type, the inter-electrode voltage for each of a plurality of adjustment positions of each variable capacitor when a radio-frequency voltage of a first frequency is applied from the RF power supply 55 to the pair of electrodes 91 and 92 is measured as first information immediately before plasma ignition. In the table illustrated in FIG. 5, the inter-electrode voltage necessary for plasma ignition is calculated at each position of C1 and C2 from the first information, which is the measured value. When the inter-electrode voltage at each position of C1 and C2 set in the table is the same as the discharge voltage or slightly higher than the discharge voltage, there is a risk of non-ignition, and when the inter-electrode voltage is higher than the discharge voltage, a largely reflected wave appears. Therefore, in the table, the inter-electrode voltage with a certain margin from the discharge voltage is calculated for each position of C1 and C2 based on the first information.

When creating the table of FIG. 5, the first information is obtained by measuring the inter-electrode voltage when the plasma is not ignited in the plasma box 19. In this way, when measuring the inter-electrode voltage, a stable voltage measurement is possible by using a low radio-frequency voltage and pressure at which plasma is not generated. Based on the first information indicating the inter-electrode voltage in a state where the radio-frequency voltage is applied from the RF power supply 55 with power that does not cause plasma discharge, the measured voltage is converted to the inter-electrode voltage in a state where a radio-frequency voltage is applied from the RF power supply 55 with a power of 100 W for plasma ignition. The converted inter-electrode voltage is stored in each position of the matrices C1 and C2 illustrated in the table of FIG. 5.

With reference to the created table, in the case of $N_2$ gas, the positions of the matrices C1 and C2 having an inter-electrode voltage that is 1000 V or more of the discharge voltage $V_B$ illustrated in FIG. 4 and not relatively high are determined as preset values of C1 and C2. By setting the initial positions of the adjustment positions of the first variable capacitors 57 (C1) and the second variable capacitor 58 (C2) to the determined preset values, reflected waves may be suppressed and a stable plasma ignition may be achieved.

Without being limited to being performed immediately before plasma ignition, the measurements indicated in the table of FIG. 5 may be performed in advance under the same conditions as those for measuring the first information prior to that. The measurement values measured in advance may be used as prior information, and after measuring the prior information, the first information may be measured immediately before plasma ignition, and the table created from the prior information may be updated based on the first information.

In this case, the range of the first information measured immediately before plasma ignition may be narrower than the measurement range of the prior information (all positions of the matrices C1 and C2 in FIG. 5). The measurement range of the first information may be a range including the matching position of plasma ignition. In the case of $N_2$ gas, the measurement range of the first information may be a range centered on the matching position of plasma ignition where the discharge voltage $V_B$ illustrated in FIG. 4 is 1000 V or more and the voltage is not relatively high. However, when the table created from the prior information is not prepared in advance, the measurement range of the initial first information is the range of 0% to 100% for both C1 and C2, that is, all positions of the matrices C1 and C2 in FIG. 5.

When the measurement range of the first information is narrower than the measurement range of the prior information, in the table of pre-stored information, the voltage at each position of the matrices C1 and C2 overlapping the measurement range of the first information is updated with the inter-electrode voltage calculated from the first information. Referring to the updated table as the table of the first information, in the case of $N_2$ gas, the positions in the matrices C1 and C2 having an inter-electrode voltage that is 1000 V or more of the discharge voltage $V_B$ illustrated in FIG. 4 and not relatively high are determined as preset values of C1 and C2.

Measurement of prior information is not always necessary. When creating the table of FIG. 5, the matching circuit of the electronic matcher 53 is made variable immediately before the plasma ignition, and a radio-frequency voltage that does not ignite plasma is applied to measure the inter-electrode voltage (or the inter-electrode current). From the measured value, the inter-electrode voltage obtained when a radio-frequency voltage that causes plasma ignition is applied may be calculated. By using the matching circuit of the electronic matcher 53, the calculation result may be obtained within, for example, one second immediately before the plasma ignition. Thus, by determining a preset value and setting the initial position of the adjustment position of each variable capacitor to the determined preset value, reflected waves may be suppressed and a stable plasma ignition may be performed. Since it takes time such as several seconds to change the matching circuit mechanically, by using the variable capacitor of the electronically controllable electronic matcher 53, optimal values of the inter-electrode voltage at each position of C1 and C2 are obtained in a short period of time immediately before the plasma ignition, thereby creating a table of the first information. As a result, since the preset value may be determined based on the latest table that best indicates the state of the inter-electrode voltage at the time of plasma ignition, each variable capacitor may be controlled at high speed to a matching position with less reflected waves.

FIG. 6 is a diagram illustrating an example of setting information such as preset values for each process type stored in the memory 102. When the example in the table of FIG. 5 is process type A, the preset value determined in the table of FIG. 5 is the matching position MP1, and 60% and 20% are stored in the preset values C1 and C2 of FIG. 6, respectively.

When the RF power supply 55 is a frequency-variable RF power supply whose frequency is variably controllable, and the frequency of the radio frequency at the time of ignition is changed from the first frequency to the second frequency, a table of the second frequency is also created. When a radio-frequency voltage of a second frequency that does not ignite plasma is applied, the inter-electrode voltage at each position in the matrices C1 and C2 in FIG. 5 is measured and used as second information. A table of the second information is created in the same manner as the table of the first information. Referring to the created table of the second information, in the case of $N_2$ gas, the positions of the matrices C1 and C2 having an inter-electrode voltage that is 1000 V or more of the discharge voltage $V_B$ illustrated in FIG. 4 and not relatively high are determined as preset values of C1 and C2. By setting the initial positions of the adjustment positions of the first variable capacitors 57 (C1) and the second variable capacitor 58 (C2) to the determined preset values, even when the radio-frequency voltage of the second frequency is applied, the reflected waves may be suppressed and a stable plasma ignition may be achieved.

In the start information "Frequency" of the setting information in FIG. 6, the frequency of the set radio frequency is stored for each process type. The start information also stores the second frequency duration time (Time) at the time of ignition, the discharge voltage (minimum ignition voltage) $V_B$, and the pressure P. Further, the power value of the traveling wave of the radio frequency is stored in Pf, and the matrix of FIG. 5 is used as the conversion value when creating. Also, the preset update warning stores a threshold value for deviation between the present preset value and the previous preset value.

[Ignition Control Method]

Figure 7:
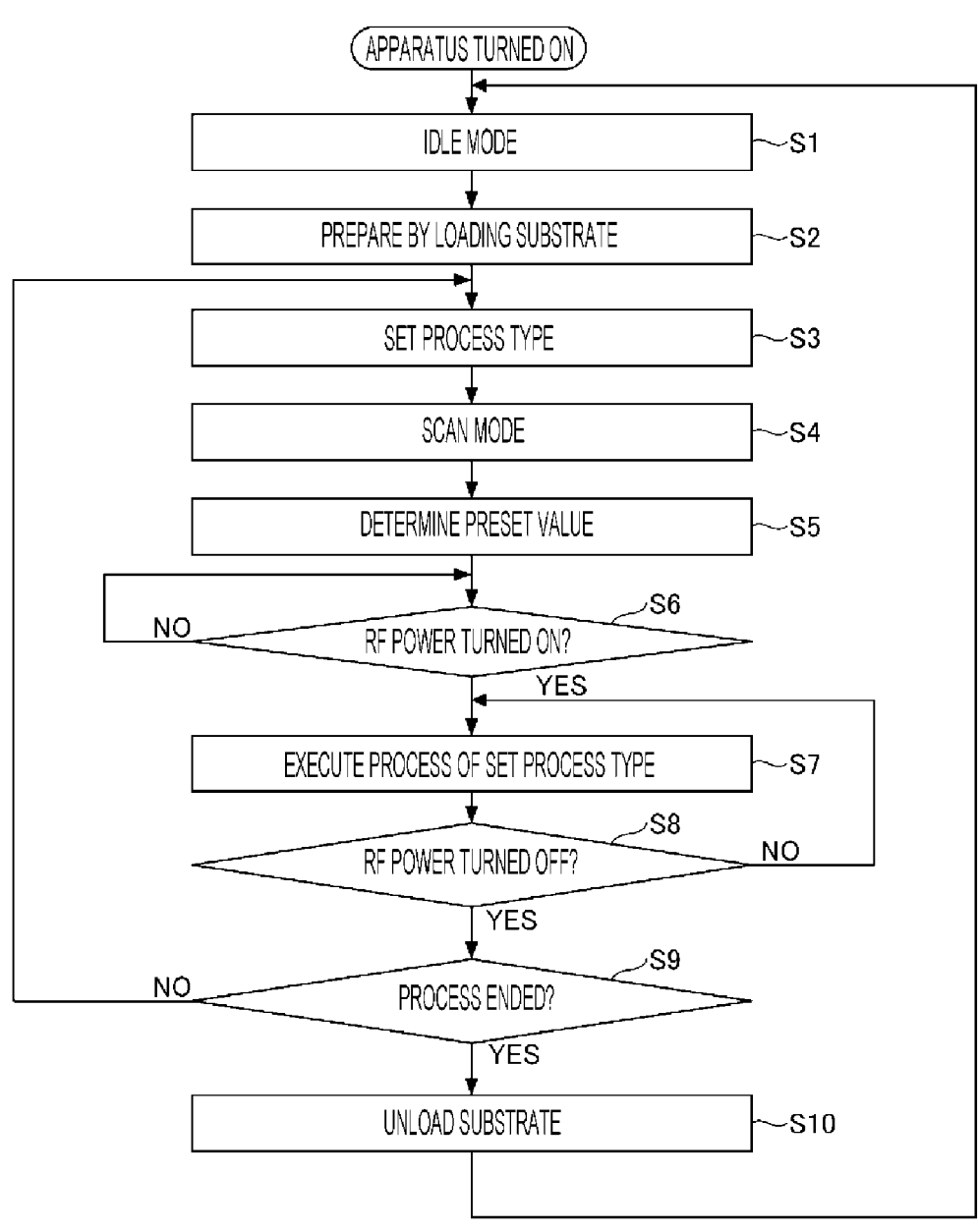
FIG. 7 is a flowchart illustrating an ignition control method according to the embodiment.

Next, an ignition control method according to the present embodiment will be described with reference to FIG. 7. FIG. 7 is a flowchart illustrating an ignition control method according to the embodiment. The ignition control method according to the embodiment is controlled by the control unit 100.

In this example, the RF power supply 55 is turned on and a radio-frequency voltage of a first frequency (e.g., 13.56 MHz) is applied. Thereafter, the frequency may be changed from the first frequency to a second frequency (e.g., 14.56 MHz), and a radio-frequency voltage of the second frequency may be applied from the RF power supply 55.

When the film forming apparatus 10 is turned on, the process of FIG. 7 is started. The frequency of the radio frequency output from the RF power supply 55 is previously set to the first frequency, and an idle mode is executed (step S1). In the idle mode, the radio-frequency voltage from the RF power supply 55 is turned off. In this state, the control unit 100 supplies nitrogen gas from the plurality of air supply ports 42A, 42B, and 42C of the vertical pipes 41A, 41B, and 41C. Further, the wafer 2 placed on the substrate holder 30 is loaded into the processing container 11 and preparations for processing are performed (step S2). In step S2, first, the transfer device places a plurality of wafers 2 on the substrate holder 30 outside the processing container 11. The substrate holder 30 holds the plurality of wafers 2 at intervals in the vertical direction. Next, the elevating unit 25 is raised to raise the cover 20 and the substrate holder 30. The wafer 2 is loaded into the processing container 11 together with the substrate holder 30, and the opening at the lower end of the processing container 11 is sealed with the cover 20.

Subsequently, the control unit 100 sets the process type of the process to be performed on the wafer 2 (step S3). Next, the control unit 100 measures the inter-electrode voltage in a state in which a low radio-frequency voltage is applied from the RF power supply 55 at a power that does not cause plasma discharge (ignition). As a result, a scan mode is executed to measure the inter-electrode voltage at each position of the matrices C1 and C2 in FIG. 5 (step S4). The control unit 100 scans the range of 0 to 100% for both C1 and C2 in increments of, for example, 5% and creates a table of first information as illustrated in FIG. 5. When a table of prior information is created, the measurement range of the first information may be relatively narrow. After the measurement, the low voltage output from the RF power supply 55 is stopped. The control unit 100 calculates an appropriate inter-electrode voltage based on the first information of the measured inter-electrode voltage, and determines the positions of C1 and C2 at which an inter-electrode voltage equal to or higher than the discharge voltage $V_B$ and not relatively high may be obtained as preset values (step S5). When a table of prior information is created, the table of prior information may be used to update the table of prior information based on the first information in steps S4 and S5, and create a table of first information.

Next, the control unit 100 determines whether the RF power supply 55 is turned on and a radio-frequency voltage with power capable of igniting plasma is applied (step S6). For example, when a radio-frequency voltage having a power set in the process recipe is applied, the control unit 100 determines that a radio-frequency voltage having a power capable of igniting plasma has been applied from the RF power supply 55.

As described above, a table of the first information is created as a table having discharge start voltages and matching positions for each temperature and pressure of each gas type according to the process type. Steps S4 and S5 are measurements performed immediately before plasma ignition. In either case, a low-power radio-frequency voltage that does not ignite plasma is applied from the RF power supply 55. The application of the radio-frequency voltage from the RF power supply 55 at this time is not determined to be ON of the RF power supply 55.

In steps S4 and S5, the inter-electrode voltage (or current) when the impedance is varied within the variable range of the electronic matcher 53 is measured in a state where a low power radio-frequency voltage that does not ignite plasma is applied from the RF power supply 55.

A table is created so that the discharge voltage for each temperature and pressure of each gas type may be obtained for each process type in a state where the RF power supply 55 applies a radio-frequency voltage at the power of plasma ignition by converting from the above measured values.

By implementing high-speed impedance matching using the electronic matcher 53, the above table may be created at high speed after the RF power supply 55 is turned on in step S6 and immediately before the plasma ignited.

Subsequently, the control unit 100 executes the process of the set process type on the wafer 2 (step S7).

Next, the control unit 100 determines whether the RF power supply 55 is turned off (step S8). When it is determined that the RF power supply 55 is not turned off, the control unit 100 continues the process of step S7. When it is determined that the RF power supply 55 is turned off, it is determined whether the process has ended (step S9).

When it is determined that the process has not ended, the control unit 100 returns to step S3 and executes the processes after step S3. When it is determined that the process has ended, the control unit 100 unloads the substrate (step S10), returns to step S1, and waits until the next wafer 2 is loaded (idle mode). When the next wafer 2 is loaded, the processes after step S2 are executed.

The frequency of the radio-frequency voltage of the RF power supply 55 may be appropriately set or changed during the idle mode. The inter-electrode voltage may be varied by changing the frequency of the power supply that supplies the RF power at the time of ignition. For example, the inter-electrode voltage may be varied by changing the frequency of the radio frequency output from the RF power supply 55 from the second frequency to the first frequency when a predetermined time has elapsed from the start of the process execution of step S7. The predetermined time may be the second frequency continuation time set in the start information of the setting information in FIG. 6.

In a matching box having a motor-controlled mechanical element (mechanical matcher), it is difficult to create the table illustrated in FIG. 5 in a short time of one second or less as in the electronic matcher 53. Therefore, when a mechanical matcher is used, it is difficult to perform a matching control based on a table that reflects the influence of impedance changes after the RF power supply 55 is turned on and immediately before plasma is ignited. The influence of the impedance change immediately before plasma ignition may cause the generation of reflected waves of the supplied radio-frequency voltage.

According to the ignition control method of the present disclosure, for example, the electronic matcher 53 may be used to grasp the change in the inter-electrode voltage due to the impedance change immediately before plasma ignition. Taking into account the influence of this change, it is possible to create a table in which the minimum ignition voltage with a margin equal to or greater than the value needed for plasma ignition is calculated for each position in the matrices C1 and C2 in a short period of time (within 1 second) immediately before plasma ignition. As a result, even when the electrodes are slightly deformed due to, for example, temperature, it is possible to create a table that reflects the influence of deformation of the electrodes on impedance matching.

In the present embodiment, the preset values of C1 and C2 are determined based on the table created immediately before plasma ignition, and the adjustment positions of the variable capacitors 57 and 58 (the initial positions of C1 and C2) are set to the determined preset values. As a result, it is possible to suppress an increase in the reflected wave due to the change in impedance immediately before plasma ignition, and to perform a stable plasma ignition.

The table may have a function of feeding back the matching position of the electronic matcher 53 at the time of plasma ignition to the table of the first information. For example, in FIG. 5, the matching position MP1 is fed back to the table of the first information.

Such a table is created for each process type. The table may be created in test mode or during the actual process. In test mode, a table of prior information is created. During the actual process, a table of first information is created. Creating a table of prior information may be omitted.

When there are multiple plasma discharge states, the inter-electrode voltage during impedance matching is monitored, and when the discharge state differs from the set process type, the process type may be correctly derived from the monitored inter-electrode voltage, automatically controlled to the correct process type, and reignited. In this way, the control unit 100 may have a function of automatically controlling the discharge state of the correct process type even when the set process type is incorrect. An alarm indicating that the process type has been automatically changed and reignited may be output (displayed) to alert the operator.

Also, the control unit 100 may output various alarms based on the setting information in FIG. 6.

When the difference between the preset values of C1 and C2 determined this time and the preset values determined previous time is equal to or greater than the threshold value illustrated in the preset update warning in FIG. 6, an alarm may be output. For example, when the current and previous preset values deviate from the threshold value by 10% or more, an alarm may be output (displayed) to alert the operator.

When the pressure P in FIG. 6 differs from the set value, an alarm may be output (displayed). For example, when the process type is A, an alarm may be output (displayed) such that the process is scheduled to be performed at 1 Torr, but is at 5 Torr when the RF power supply 55 is turned on.

[Film Forming Method]

Figure 8:
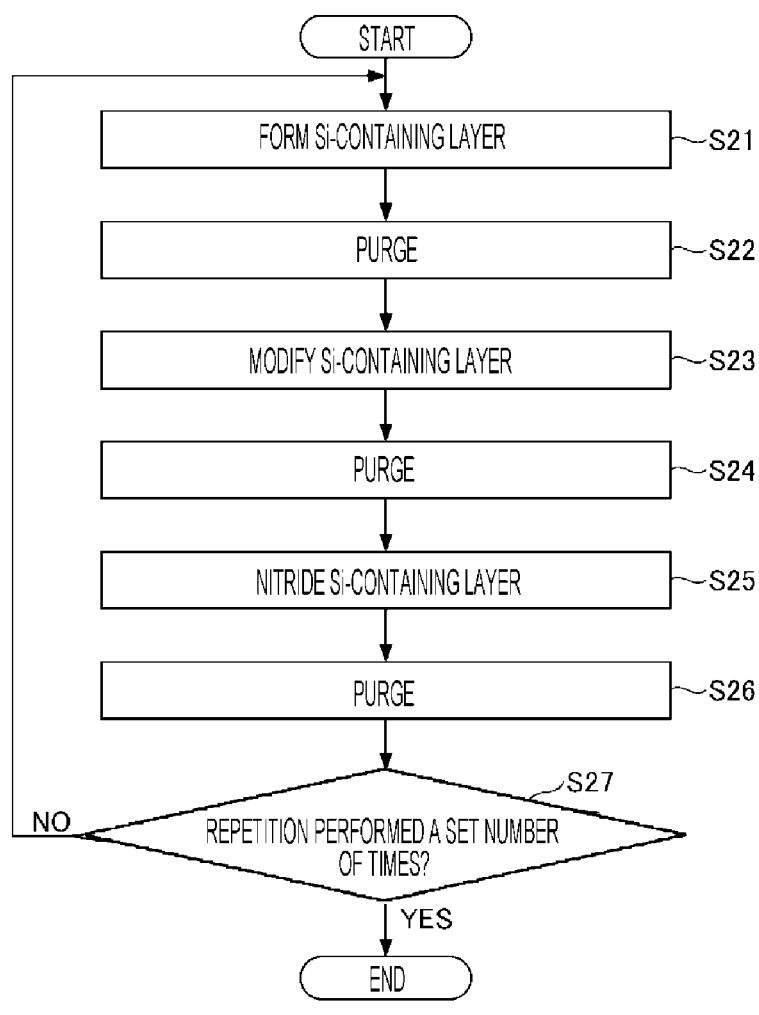
FIG. 8 is a flowchart illustrating a film forming method according to the embodiment.
Figure 9:
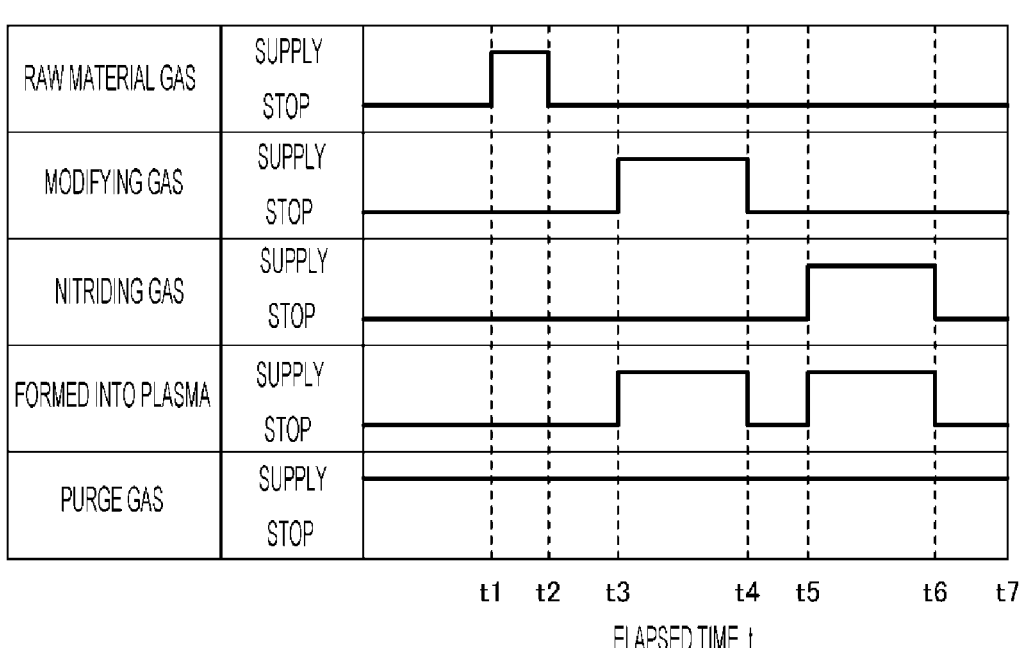
FIG. 9 is a time chart illustrating the film forming method according to the embodiment.

Next, a film forming method according to the embodiment will be described with reference to FIGS. 8 and 9. FIG. 8 is a flowchart illustrating a film forming method according to the embodiment. FIG. 9 is a time chart illustrating the film forming method according to the embodiment. The film forming method according to the embodiment is controlled by the control unit 100. The film forming method of FIG. 8 is an example of the process executed in step S7 of FIG. 7.

When the film forming method is started, the control unit 100 forms a Si-containing layer on the wafer 2 held by the substrate holder 30 (step S21). Step S21 is performed from time t1 to time t2 illustrated in FIG. 9. In step S21, the raw material gas is supplied from the raw material gas supply source 70 into the processing container 11 while the inside of the processing container 11 is evacuated by the exhaust device connected to the exhaust pipe 45. The raw material gas is, for example, DCS gas. A Si-containing layer is thereby formed on the wafer 2. The time for step S21 is, for example, 1 second or more and 10 seconds or less.

Next, the control unit 100 performs a purge step (step S22). Step S22 is performed from time t2 to time t3 illustrated in FIG. 9. In step S22, the purge gas is supplied to the inside of the processing container 11 while the inside of the processing container 11 is evacuated by the exhaust device. As a result, the gas remaining inside the processing container 11 is replaced with the purge gas. The purge gas may be nitrogen gas, argon gas, other inert gas, or a combination thereof. The time for step S22 is, for example, 3 seconds or more and 10 seconds or less. The purge gas may be supplied from a nitriding gas supply source 80.

Next, the control unit 100 performs a modifying step of the Si-containing layer (step S23). Step S23 is performed from time t3 to time t4 illustrated in FIG. 9. In step S23, the modifying gas is supplied into the processing container 11 by the modifying gas supply source 75 while the inside of the processing container 11 is evacuated by the exhaust device. Further, in step S23, plasma is ignited in either the plasma box 19 or the processing container 11 to form the modifying gas into plasma. In step S23, the ignition control method according to the embodiment is executed, and the control unit 100 controls the initial positions of the first variable capacitor 57 and the second variable capacitor 58 so that either the plasma box 19 or the processing container 11 is selected as the plasma ignition region.

The modifying gas is, for example, nitrogen gas. The modifying gas may be hydrogen gas or ammonia gas. The modifying gas may be a gas containing nitrogen gas or a gas containing hydrogen gas. The Si-containing layer is modified with the modifying gas formed into plasma. Modifying the Si-containing layer includes, for example, removing halogen elements contained in the Si-containing layer. By removing the halogen elements, dangling bonds of Si may be formed. As a result, the Si-containing layer may be activated and the nitriding of the Si-containing layer may be promoted. The frequency of the radio frequency of the RF power supply 55 is, for example, 13.56 MHz or 14.56 MHz. The time for step S23 is, for example, 3 seconds or more and 60 seconds or less.

Next, the control unit 100 performs a purge step (step S24). Step S24 is performed from time t4 to time t5 illustrated in FIG. 9. In step S24, the purge gas is supplied to the inside of the processing container 11 while the inside of the processing container 11 is evacuated by the exhaust device. As a result, the gas remaining inside the processing container 11 is replaced with the purge gas. The time for step S24 is, for example, 3 seconds or more and 10 seconds or less. The purge gas may be nitrogen gas, and may be supplied from the nitriding gas supply source 80.

Next, the control unit 100 performs a nitriding process for the Si-containing layer (step S25). Step S25 is performed from time t5 to time t6 illustrated in FIG. 9. In step S25, the nitriding gas is supplied into the processing container 11 by the nitriding gas supply source 80 while the inside of the processing container 11 is evacuated by the exhaust device. Further, in step S25, plasma is ignited in either the plasma box 19 or the processing container 11 to form the nitriding gas into plasma. In step S25, the ignition control method according to the embodiment is executed, and the control unit 100 controls the initial positions of the first variable capacitor 57 and the second variable capacitor 58 so that either the plasma box 19 or the processing container 11 is selected as the plasma ignition region. The nitriding gas is, for example, ammonia gas. The Si-containing layer is nitrided with the ammonia gas formed into plasma. The time for step S25 is, for example, 5 seconds or more and 120 seconds or less.

Next, the control unit 100 performs a purge step (step S26). Step S26 is performed from time t6 to time t7 illustrated in FIG. 9. In step S26, the purge gas is supplied to the inside of the processing container 11 while the inside of the processing container 11 is evacuated by the exhaust device. As a result, the gas remaining inside the processing container 11 is replaced with the purge gas. The time for step S26 is, for example, 3 seconds or more and 10 seconds or less. The purge gas may be nitrogen gas, and may be supplied from the nitriding gas supply source 80.

Next, the control unit 100 determines whether a set number of times has been repeated (step S27). The set number of times is set in advance, and when the control unit 100 determines that the set number of times has not been repeated, the process returns to step S21 and the cycle of steps S21 to S27 is repeated. While the cycle is being repeated, the temperature of the wafer 2 is, for example, 400° C. or higher and 600° C. or lower, and the pressure inside the processing container 11 is, for example, 13 Pa or more and 665 Pa or less.

When it is determined that the process has been repeated the set number of times, a silicon nitride film having the desired film thickness and quality has been formed, and the control unit 100 ends this process.

In the film forming method described above, the purge step may be omitted. The film forming method according to the embodiment includes at least the following steps (A), (B), and (C):

(A) supplying a raw material gas containing an element to be nitrided to a substrate to form a layer containing the element on the substrate;

(B) supplying nitrogen gas, hydrogen gas, or ammonia gas activated by plasma after supplying the raw material gas to the substrate to modify the layer containing the element; and (C) supplying the nitrogen-containing gas activated by plasma to nitride the element.

Then, in step (B), plasma is ignited using the ignition control method described above.

As described above, according to the ignition control method, film forming method, and film forming apparatus of the present embodiment, it is possible to suppress reflected waves and perform a more stable plasma ignition. Thus, controllability of the film thickness and film quality of the film formed on the wafer may be improved.

The ignition control method, film forming method, and film forming apparatus according to the embodiments disclosed herein need to be considered as examples in all respects and not restrictive. The embodiments may be modified and improved in various ways without departing from the scope and spirit of the appended claims. The items described in the above embodiments may take other configurations within a consistent range, and may be combined within a consistent range.

Each process of the ignition control method illustrated in FIG. 7 and the film forming method illustrated in FIG. 8 is automatically performed mainly based on the control of the control unit 100.

According to an aspect of the present disclosure, a more stable plasma ignition may be performed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An ignition control method comprising:
providing a film forming apparatus including:
a processing container configured to accommodate a substrate;
a plasma box formed in the processing container;
a pair of electrodes disposed in the processing container to sandwich the plasma box; and
a radio-frequency (RF) power supply connected to the pair of electrodes via a matching box having a variable capacitor,
the ignition control method further comprising:
(a) setting, by a control unit, a process recipe, the process recipe defining at least one of (i) a frequency of the RF power supply, (ii) a type of gas supplied into the processing container, and (iii) an internal pressure or temperature of the processing container for specifying a processing condition of the substrate;

(b) obtaining, by a sensor, first information representing a measured inter-electrode voltage between the pair of electrodes for each of a plurality of adjustment positions of the variable capacitor when a radio-frequency voltage of a first frequency is applied from the RF power supply at a power level insufficient to ignite plasma;

(c) determining, by the control unit, a preset value of the variable capacitor based on the first information measured in (b); and (d) setting, by the control unit, an initial position of each of the variable capacitor corresponding to the preset value determined in (c).

2. The ignition control method according to claim 1, wherein the matching box having the variable capacitor is an electronic matcher that does not contain mechanical elements.

3. The ignition control method according to claim 1, further comprising:

(e) obtaining in advance prior information representing the measured inter-electrode voltage between the pair of electrodes for each of the plurality of adjustment positions of the variable capacitor when the radio-frequency voltage of the first frequency is applied from the RF power supply to the pair of electrodes, and storing the prior information in a storage in advance, wherein in (c), the preset value of the variable capacitor is determined based on the prior information and the first information.

4. The ignition control method according to claim 3, wherein the first information obtained in (b) indicates the voltage between the electrodes for each of the plurality of adjustment positions within a narrower range than the plurality of adjustment positions of the prior information measured in (e).

5. The ignition control method according to claim 1, wherein in (b), the first information is obtained immediately before plasma ignition.

6. The ignition control method according to claim 1, wherein the RF power supply is a frequency-variable RF power supply whose frequency is variably controllable, in (b), when a frequency of the frequency-variable RF power supply is changed from the first frequency to a second frequency, second information representing a measured inter-electrode voltage between the electrodes for each of the plurality of adjustment positions of the variable capacitor is measured when a radio-frequency voltage of the second frequency is applied from the frequency-variable RF power supply to the pair of electrodes for each process type, and in (c), the preset value of the variable capacitor is determined based on the second information measured in (b).

7. The ignition control method according to claim 1, wherein in (c), an alarm is output when a difference between a preset value determined in a current operation and a preset value determined in a previous operation is equal to or greater than a threshold value.

8. A method of forming a nitride film on a substrate, the method comprising:

(A) supplying a raw material gas containing an element to be nitrided to the substrate, thereby forming a layer containing the element on the substrate;

(B) after supplying the raw material gas to the substrate, supplying nitrogen gas, hydrogen gas, or ammonia gas activated by plasma, thereby modifying the layer containing the element; and (C) supplying a nitrogen-containing gas activated by plasma, thereby nitriding the element, wherein in (B), a plasma ignition is performed using the ignition control method according to claim 1.

9. A film forming apparatus comprising:

a processing container configured to accommodate a substrate;

a plasma box formed in the processing container;

a pair of electrodes disposed in the processing container to sandwich the plasma box;

a radio-frequency (RF) power supply connected to the pair of electrodes via a matching box having a variable capacitor; and a controller, wherein the controller is configured to control a process including:

(a) setting a process recipe, the process recipe defining by at least one of (i) a frequency of the RF power supply, (ii) a type of gas supplied into the processing container, and (iii) an internal pressure or temperature of the processing container;

(b) obtaining, by a sensor, first information representing a measured inter-electrode voltage between the pair of electrodes for each of a plurality of adjustment positions of the variable capacitor when a radio-frequency voltage of a first frequency is applied from the RF power supply at a power level insufficient to ignite plasma;

(c) determining a preset value of the variable capacitor based on the first information measured in (b); and (d) setting an initial position of each of the variable capacitor corresponding to the preset value determined in (c).

* * * * *